(12) United States Patent
Ghosh et al.

(10) Patent No.: US 11,349,492 B2
(45) Date of Patent: May 31, 2022

(54) ANALOG-TO-DIGITAL CONVERTER

(71) Applicant: TEXAS INSTRUMENTS INCORPORATED, Dallas, TX (US)

(72) Inventors: Sovan Ghosh, Paschim Medinipur (IN); Minkle Eldho Paul, Bengaluru (IN); Laxmi Vivek Tripurari, Hyderabad (IN); Amal Kumar Kundu, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/112,095

(22) Filed: Dec. 4, 2020

(65) Prior Publication Data
US 2021/0119638 A1 Apr. 22, 2021

Related U.S. Application Data

(63) Continuation of application No. 16/656,913, filed on Oct. 18, 2019, now Pat. No. 10,886,933.

(51) Int. Cl.
*H03M 1/12* (2006.01)
*H03M 1/46* (2006.01)
(Continued)

(52) U.S. Cl.
CPC ......... *H03M 1/468* (2013.01); *H03M 1/1047* (2013.01); *H03M 1/124* (2013.01);
(Continued)

(58) Field of Classification Search
CPC ........ H03M 1/12; H03M 1/1009; H03M 1/00; G11C 27/02
(Continued)

(56) References Cited

U.S. PATENT DOCUMENTS 10,084,467 B1 9/2018 Chang et al.
10,211,847 B1 2/2019 Chung et al.
(Continued)

FOREIGN PATENT DOCUMENTS

JP H09259597 3/1997

OTHER PUBLICATIONS

International Search Report in corresponding PCT Application No. PCT/US2020/056271, dated Jan. 21, 2021 (2 pages).

*Primary Examiner* — Joseph J Lauture
(74) *Attorney, Agent, or Firm* — John R. Pessetto; Charles A. Brill; Frank D. Cimino

(57) ABSTRACT

An analog-to-digital converter (ADC) circuit includes a signal input terminal, a sample-and-hold circuit, and a successive approximation register (SAR) ADC. The sample-and-hold circuit includes an input terminal coupled to the signal input terminal. The SAR ADC includes a comparator, a first capacitive digital-to-analog converter (CDAC), and a second CDAC. The first CDAC includes a first input terminal coupled to the signal input terminal, a second input terminal coupled to an output terminal of the sample-and-hold circuit, and an output terminal coupled to a first input terminal of the comparator. The second CDAC includes a first input terminal coupled to the signal input terminal, an output terminal coupled to a second input terminal of the comparator.

9 Claims, 5 Drawing Sheets

(51) Int. Cl.
  *H03M 1/10* (2006.01)
  *H03M 1/06* (2006.01)
  *G11C 27/02* (2006.01)
  *H03M 1/00* (2006.01)
(52) U.S. Cl.
  CPC ............ *H03M 1/462* (2013.01); *G11C 27/02* (2013.01); *H03M 1/00* (2013.01); *H03M 1/06* (2013.01); *H03M 1/1009* (2013.01); *H03M 1/12* (2013.01)
(58) Field of Classification Search
  USPC ..................... 341/155, 120, 122, 118, 161
  See application file for complete search history.

(56) References Cited

U.S. PATENT DOCUMENTS

| | | |
|---|---|---|
| 2007/0035434 A1 | 2/2007 | Tachibana |
| 2013/0222335 A1* | 8/2013 | Lee .................... G06F 3/04166 345/174 |
| 2016/0182075 A1* | 6/2016 | Devarajan ............. H03M 1/128 341/120 |
| 2018/0083647 A1 | 3/2018 | Yoshioka et al. |
| 2019/0097646 A1* | 3/2019 | Chuang ................... H03M 1/68 |

* cited by examiner

ANALOG-TO-DIGITAL CONVERTER

CROSS-REFERENCE TO RELATED APPLICATION(S)

This continuation application claims priority to U.S. patent application Ser. No. 16/656,913, filed Oct. 18, 2019, which application is incorporated herein by reference in its entirety.

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations is typically determined by the noise level in a particular iteration as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten-bit resolution theoretically ten iterations are required, and for twenty bits of resolution theoretically twenty iterations are required.

SUMMARY

A two-step successive approximation register (SAR) analog-to-digital converter (ADC) that improves coarse SAR ADC resolution by dynamic error correction is disclosed herein. In one example, an analog-to-digital converter (ADC) circuit includes a signal input terminal, a sample-and-hold circuit, and a successive approximation register (SAR) ADC. The sample-and-hold circuit includes an input terminal coupled to the signal input terminal. The SAR ADC includes a comparator, a first capacitive digital-to-analog converter (CDAC), and a second CDAC. The first CDAC includes a first input terminal coupled to the signal input terminal, a second input terminal coupled to an output terminal of the sample-and-hold circuit, and an output terminal coupled to a first input terminal of the comparator. The second CDAC includes a first input terminal coupled to the signal input terminal, an output terminal coupled to a second input terminal of the comparator.

In another example, an analog-to-digital converter (ADC) circuit includes a sample-and-hold circuit and a SAR ADC. The sample-and-hold circuit is configured to sample an input signal to be digitized. The SAR ADC is coupled to the sample-and-hold circuit, and is configured to digitize the input signal. The SAR ADC includes a comparator, a first CDAC, and a second CDAC. The first CDAC is coupled to a first input of the comparator, and is configured to sample the input signal to be digitized, and sample an output of the sample-and-hold circuit. The second CDAC is coupled to a second input of the comparator, and is configured to sample the input signal to be digitized.

In a further example, an ADC circuit includes a first signal input terminal, a second signal input terminal, a first sample-and-hold circuit, a second sample-and-hold circuit, and a SAR ADC. The first sample-and-hold circuit includes an input terminal coupled to the first signal input terminal. The second sample-and-hold circuit includes an input terminal coupled to the second signal input terminal. The SAR ADC includes a comparator, a first CDAC, and a second CDAC. The first CDAC includes a first input terminal coupled to the first signal input terminal, a second input terminal coupled to an output terminal of the first sample-and-hold circuit, and an output terminal coupled to a first input terminal of the comparator. The second CDAC includes a first input terminal coupled to the second signal input terminal, a second input terminal coupled to an output terminal of the second sample-and-hold circuit, an output terminal coupled to a second input terminal of the comparator.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In two-step successive approximation register (SAR) analog-to-digital converters (ADCs), the resolution of the coarse stage SAR ADC is limited by sampling bandwidth mismatch, clock skew, and other factors. Some two-step SAR ADCs attempt to provide improved resolution by using a sample-and-hold amplifier or by merging the capacitive analog-to-digital converter (CDAC) of the coarse ADC and the main CDAC. However, sample-and-hold amplifiers consume excessive power and merging the coarse ADC CDAC and the main CDAC limits conversion speed.

The two-step SAR ADCs disclosed herein increase coarse ADC resolution by reducing errors associated with sampling bandwidth mismatch without addition of a sample-and-hold amplifier or merging the coarse ADC CDAC and the main CDAC. The two-step SAR ADCs of the present disclosure modify the search destination of the coarse SAR ADC during conversion to compensate for signal dependent residual error in the different sampling paths. Implementations use a down-scaled replica of the main CDAC to produce sampled input voltage of the MAIN CDAC and apply the sampled input voltage in the coarse ADC CDAC to adjust the search destination of the coarse SAR ADC. The adjusted search destination compensates for error in the different sampling paths.

Figure 1:
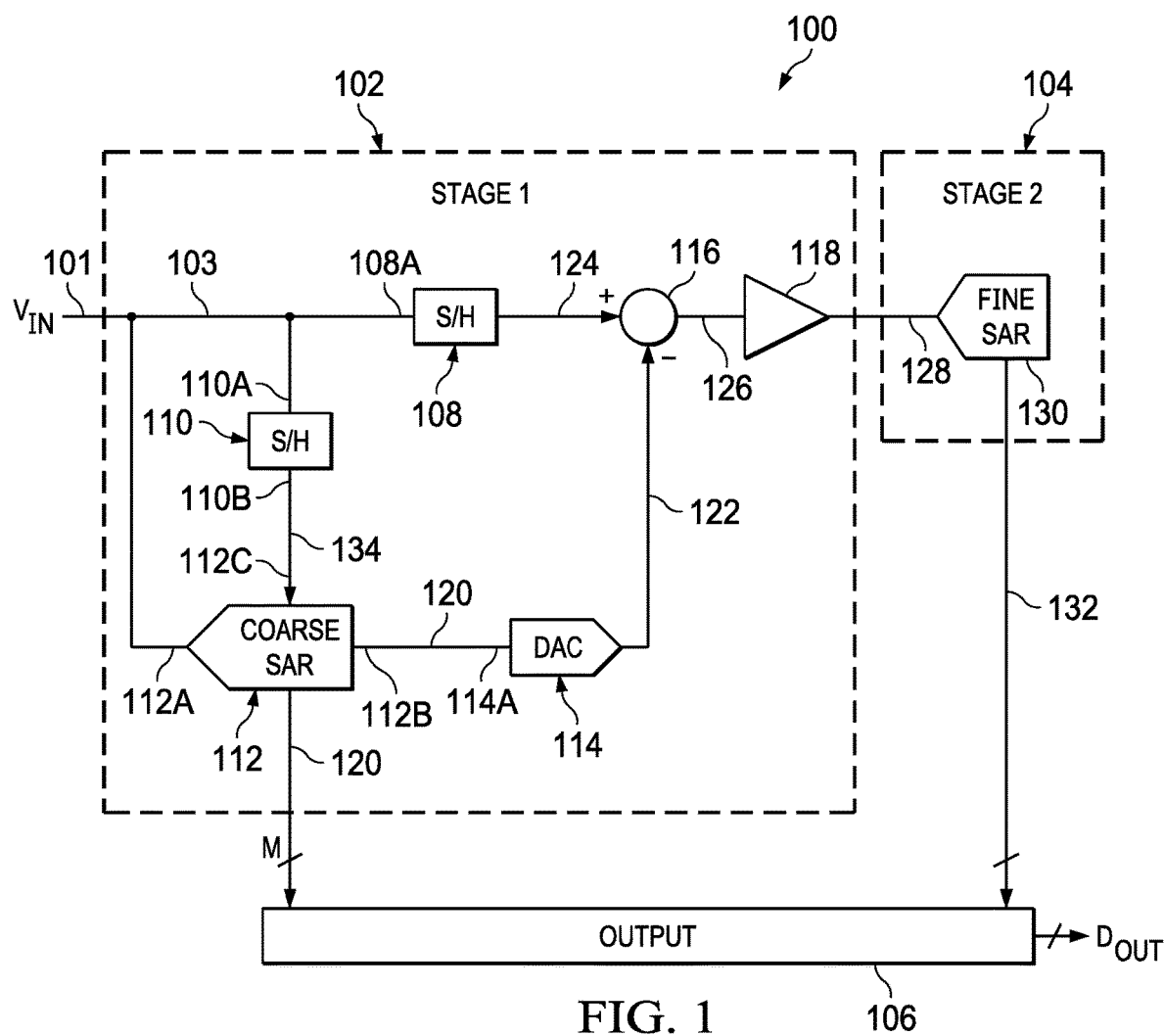
FIG. 1 shows a block diagram for a two-step successive approximation register (SAR) analog-to-digital converter (ADC) in accordance with this description.

FIG. 1 shows a block diagram for a two-step successive approximation register (SAR) analog-to-digital converter (ADC) 100 in accordance with this description. The two-step SAR ADC 100 includes a first stage 102, a second stage 104, and output circuitry 106. The two-step SAR ADC 100 generates an M-bit digital output representing an analog signal received at the signal input terminal 101. The first stage 102 generates a predetermined number of the most significant of the M bits, and the second stage 104 generates the remainder of the M-bits. For example, in an implementation of the two-step SAR ADC 100 that generates a 16-bit output, the first stage 102 generates the 6 most significant bits (with 1 or more additional redundant bits), and the second stage 104 generates the 10 least significant bits. The output circuitry 106 receives the digital values generated by the first stage 102 and the second stage 104, and combines (e.g., concatenation with overlapping) the digital values to produce a digital output value. The two-step architecture allows for a reduction in the size of the capacitors used in the first stage 102 and the second stage 104.

The first stage 102 includes a sample-and-hold circuit 108, a sample-and-hold circuit 110, a SAR ADC 112, a digital-to-analog converter (DAC) 114 (the main DAC), subtraction circuitry 116, and a residue amplifier 118. The sample-and-hold circuit 108, the sample-and-hold circuit 110, and the SAR ADC 112 are coupled to the signal input terminal 101. The sample-and-hold circuit 108 includes an input terminal 108A coupled to the signal input terminal 101, the sample-and-hold circuit 110 includes an input terminal 110A coupled to the signal input terminal 101, and the SAR ADC 112 includes an input terminal 112A coupled to the signal input terminal 101. Each of the sample-and-hold circuit 108, the sample-and-hold circuit 110, and the SAR ADC 112 acquires a sample of the input signal 103 to be digitized as provided at the signal input terminal 101. The output terminal 112B of the SAR ADC 112 is coupled to the output circuitry 106 and the input terminal 114A of the DAC 114. The SAR ADC 112 digitizes the acquired sample and provides the digital value 120 to the output circuitry 106 and the DAC 114. The DAC 114 converts the digital value 120 to an analog voltage 122. The subtraction circuitry 116 is coupled to the sample-and-hold circuit 108, the DAC 114, and the residue amplifier 118. The subtraction circuitry 116 subtracts the analog voltage 122 from the sample 124 provided by the sample-and-hold circuit 108 to produce a residue signal 126 representing total unadjusted error of the SAR ADC 112. The residue amplifier 118 is coupled to the subtraction circuitry 116, and amplifiers the residue signal 126 to produce an amplified residue signal 128.

The second stage 104 includes a SAR ADC 130. The SAR ADC 130 is coupled to the residue amplifier 118, and digitizes the amplified residue signal 128 to generate the digital value 132. The SAR ADC 130 provides the digital value 132 to the output circuitry 106 for combination with the digital value 120.

Figure 2:
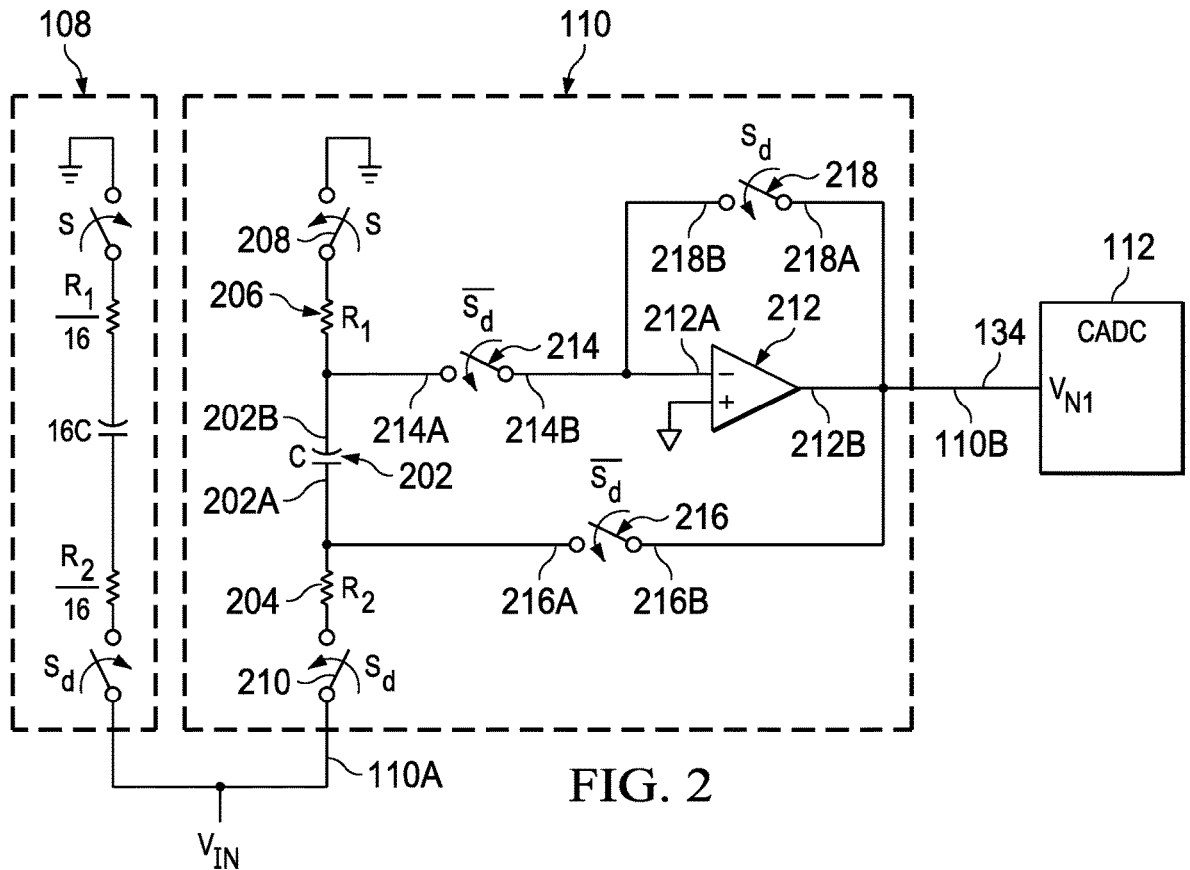
FIG. 2 shows a schematic diagram for a sample-and-hold circuit and a buffer in accordance with this description.

The sample-and-hold circuit 110 is a down-scaled version of the sample-and-hold circuit 108. The sample-and-hold circuit 110 includes an input terminal 110A coupled to the signal input terminal 101 and an output terminal 110B coupled to the input terminal 112C of the SAR ADC 112. For any given sample 124 acquired by the sample-and-hold circuit 108, the sample-and-hold circuit 110 acquires a sample 134 having a same voltage as the sample 124. FIG. 2 shows a schematic diagram for an implementation of the sample-and-hold circuit 110 in accordance with this description. The sample-and-hold circuit 108 and the SAR ADC 112 are also shown in FIG. 2 for reference. In FIG. 2, the sample-and-hold circuit 108 includes a higher capacitance and lower resistances than the sample-and-hold circuit 110. The ratio of capacitance and resistance of the sample-and-hold circuit 110 to capacitance and resistance of the sample-and-hold circuit 108 varies in different implementations of the two-step SAR ADC 100.

The sample-and-hold circuit 110 includes a sampling capacitor 202, a resistor 204 (representing switch resistance), a resistor 206 (representing switch resistance), a switch 208, a switch 210, an amplifier 212, a switch 214, a switch 216, and a switch 218. The switches 208 and 210 are closed when sampling the input signal 103 and opened when sampling is complete and the sample-and-hold circuit 110 is in a hold state. The amplifier 212 buffers the voltage across the sampling capacitor 202 for provision to the SAR ADC 112. During sampling (e.g., in a sample interval), the switch 214 and the switch 216 are open and the switch 218 is closed, disconnecting the amplifier 212 from the sampling capacitor 202. Similarly, when the sample-and-hold circuit 110 is in the hold state (e.g., in a hold interval), the switch 214 and the switch 216 are closed, and the switch 218 is open, connecting the amplifier 212 from the sampling capacitor 202.

The amplifier 212 includes an input terminal 212A coupled to the sampling capacitor 202 via the switch 214, and an output terminal 212B coupled to the input terminal 112C of the SAR ADC 112. The switch 214 includes a terminal 214A coupled to a terminal 202B of the sampling capacitor 202, and a terminal 214B coupled to the input terminal 212A of the amplifier 212. The switch 216 includes a terminal 216A coupled to the terminal 202A of the sampling capacitor 202, and a terminal 216B coupled to the output terminal 212B of the amplifier 212. The switch 218 includes a terminal 218A coupled to the output terminal 212B of the amplifier 212, and a terminal 218B coupled to the input terminal 212A of the amplifier 212.

Figure 3:
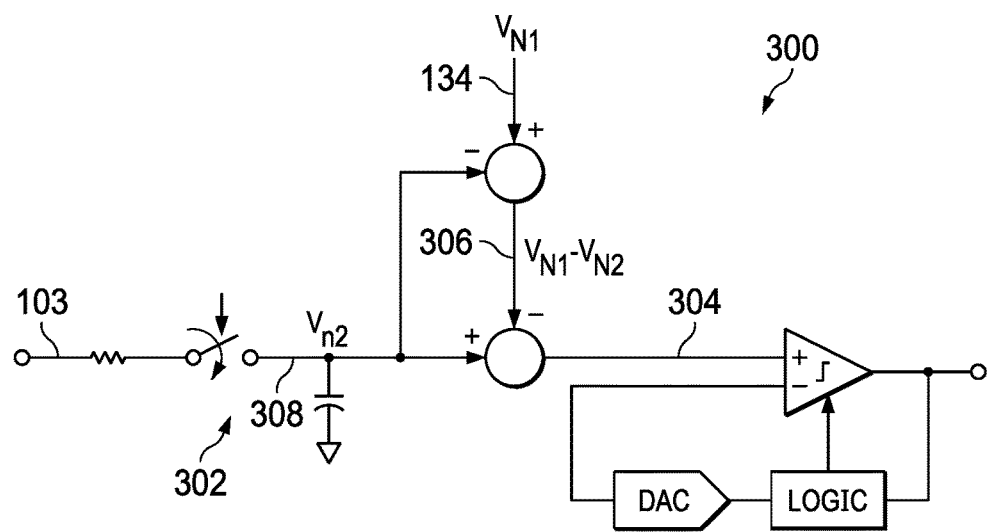
FIG. 3 shows a block diagram for a first stage of a two-step SAR ADC with dynamic error connection in accordance with this description.

FIG. 3 shows a block diagram for a coarse SAR ADC 300. The coarse SAR ADC 300 is an implementation of the SAR ADC 112. The coarse SAR ADC 300 includes a sampling network 302 for sampling the input signal 103. The sampled signal 308 ($V_{n2}$) is provided at an output of the sampling network 302. However, because of differences in sampling bandwidth, the sampled signal 308 is different from the sample 134 ($V_{n1}$) provided by the sample-and-hold circuit 110. As previously explained, the sample 134 is the same as the sample 124 from which the residue signal 126 is derived. The coarse SAR ADC 300 compensates for the difference in the sampled signal 308 and the sample 124 by taking the difference of the sample 134 and the sampled signal 308, and subtracting the difference from the sampled signal 308 to produce voltage 304, which is the same as the voltage of sample 134, for use as a reference in digitization.

Figure 4:
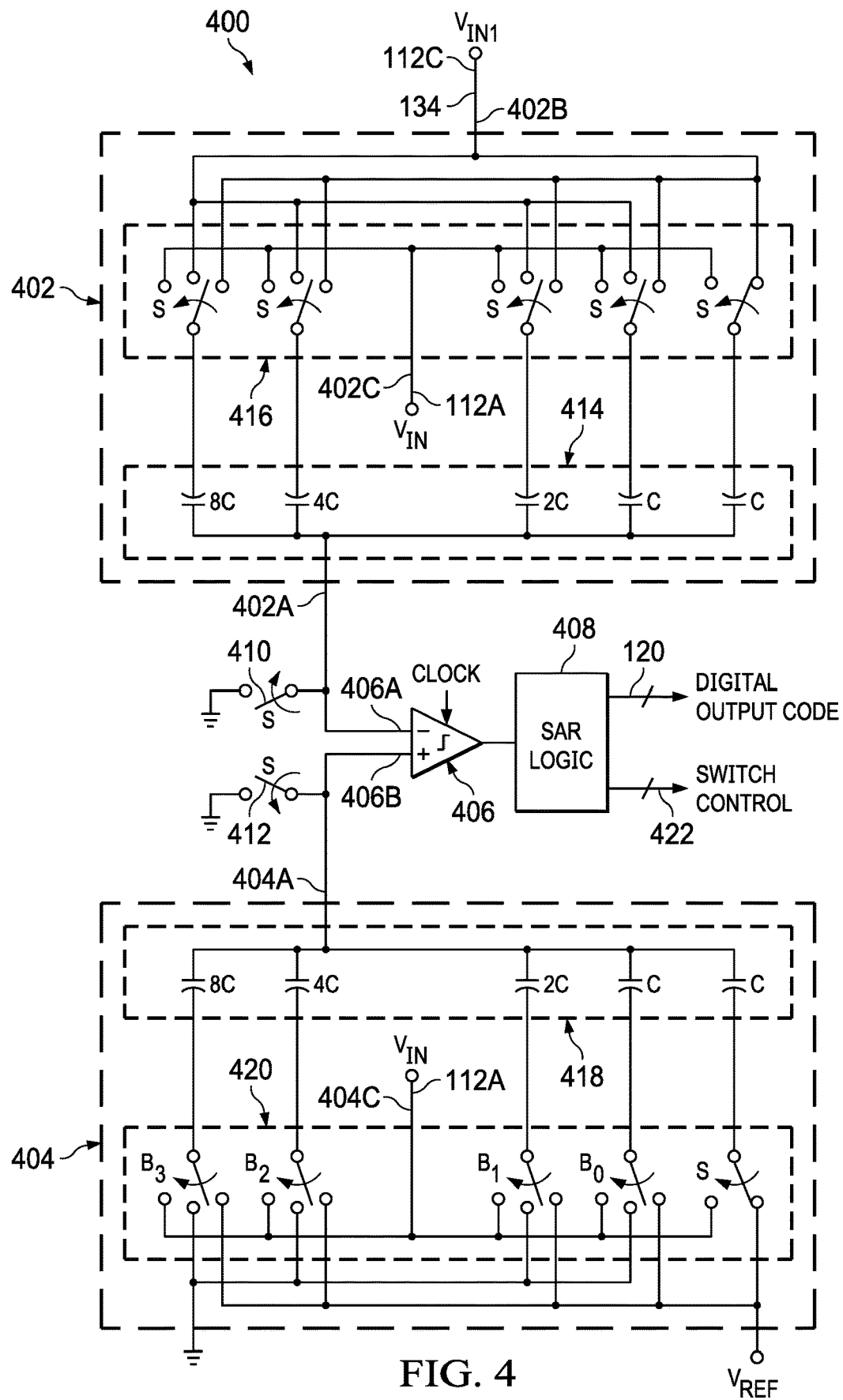
FIG. 4 shows a schematic diagram for a coarse SAR ADC in accordance with this description.

FIG. 4 shows a schematic diagram for a coarse SAR ADC 400 in accordance with this description. The SAR ADC 400 is an implementation of the SAR ADC 112 and the SAR ADC 300. The SAR ADC 400 includes a CDAC 402, a CDAC 404, a comparator 406, a SAR control circuit 408, a switch 410 and a switch 412. The CDAC 402 includes binary weighted capacitors 414 and switches 416. The switches 416 are controllable to connect the bottom plates of the binary weighted capacitors 414 to the input terminal 112A or the input terminal 112C, and thereby to charge the binary weighted capacitors 414 to the input signal 103 or the sample 134. The CDAC 402 includes an output terminal 402A coupled to an input terminal 406A of the comparator 406, an input terminal 402b coupled to the input terminal 112C of the SAR ADC 112, and an input terminal 402C coupled to the input terminal 112A of the SAR ADC 112. The top plates of the binary weighted capacitors 414 are coupled to an output terminal 402A.

Similarly, the CDAC 404 includes binary weighted capacitors 418 and switches 420. The switches 420 are controllable to connect the bottom plates of the binary weighted capacitors 418 to the input terminal 112A, a reference voltage source, or a common voltage source (e.g., ground). The switches 410 and 412 are controllable to respectively connect the top plates of the binary weighted capacitors 414 and the binary weighted capacitors 418 to ground. The CDAC 404 includes an output terminal 404A coupled to an input terminal 406B of the comparator 406, and an input terminal 404C coupled to the input terminal 112A of the SAR ADC 112. The top plates of the binary weighted capacitors 418 are coupled to an output terminal 404A.

The comparator 406 compares the voltage on the top plates of the binary weighted capacitors 418 to the voltage on the top plates of the binary weighted capacitors 414, and provides a result of the comparison to the SAR control circuit 408. The SAR control circuit 408 is coupled to the comparator 406, the CDAC 402, and the CDAC 404, sets the bits of the digital value 120 based on the results of the comparison. The SAR control circuit 408 generates the switch control signals 422 that control the switch 410, the switch 412, the switches 416, and the switches 420. The SAR control circuit 408 determines, based on the output of the comparator 406, how the switches 420 are to be set, and activates the switch control signals 422 accordingly.

At the start of each sample digitization (Acquisition Phase), the SAR control circuit 408 sets the switches 416 and the switches 420 to connect the bottom plates of the binary weighted capacitors 414 and the binary weighted capacitors 418 to the input terminal 112A of the SAR ADC 112 so that the binary weighted capacitors 414 and the binary weighted capacitors 418 are charged to the input signal 103. After the SAR control circuit 408 selects the values of one or more bits (the number of bits is based on the redundancy required to correct the dynamic error) of the digital value 120, the SAR control circuit 408 sets the switches 416 of the CDAC 402 to connect the bottom plates of the binary weighted capacitors 414 to the input terminal 112C of the SAR ADC 112, thereby applying the sample 134 to the bottom plate of binary weighted capacitors 414. As a result, the voltage on the top plates of the binary weighted capacitors 414 is set to the voltage of the sample 134 less the voltage previously sampled from the input terminal 112A (i.e., $V_{n1}$-$V_{n2}$). Thus, the reference voltage applied to the comparator 406 is shifted from zero to $V_{n1}$-$V_{n2}$, and digitization continues. By shifting the reference from zero to $V_{n1}$-$V_{n2}$, the voltage digitized by the SAR ADC 400 is effectively the voltage of the sample 134 rather than voltage sampled by the binary weighted capacitors 418 from the input terminal 112A.

Figure 5:
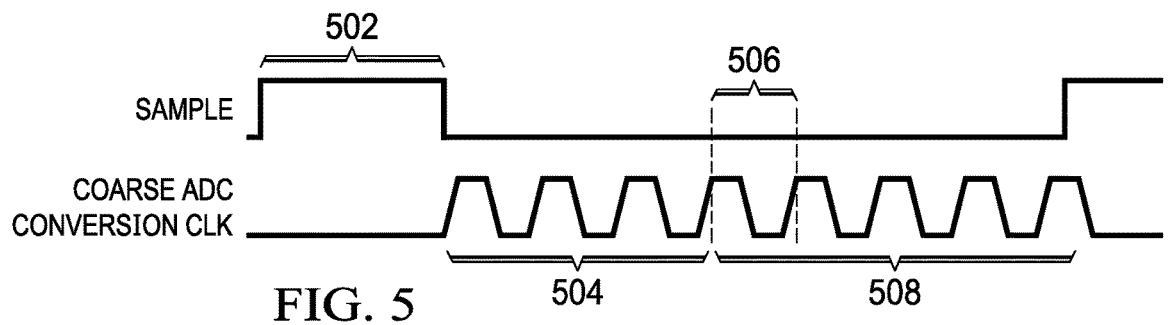
FIG. 5 shows a timing diagram for digitization in a coarse SAR ADC in accordance with this description.

FIG. 5 shows a timing diagram for digitization using the SAR ADC 400 as the coarse SAR ADC in the two-step SAR ADC 100. In interval 502, the sample-and-hold circuit 108, the sample-and-hold circuit 110, the CDAC 402, and the CDAC 404 sample the input signal 103. At the end of the interval 502, the switches 214 and 216 are closed, and the output of the amplifier 212 settles over the interval 504. At the end of the interval 502, the switches 416 are set to disconnect the signal input terminal 101 from the binary weighted capacitors 414. During the interval 514, the bottom plates of the capacitors 416 are floating. At the end of the interval 504, before the DEC bit interval, switches 416 are set to connect the output terminal 110B of the sample-and-hold circuit 110 to the binary weighted capacitors 414, so the top plates of the binary weighted capacitors 414 go to $V_{n1}$-$V_{n2}$. In the interval 506, error in the bits selected in the interval 504 is determined (error related to use of zero as the reference on the interval 504). The error is digitally corrected after digitization by the two-step SAR ADC 100 is complete in some implementations. In the interval 508, the remaining bits decisions are made in the SAR ADC 400 using $V_{n1}$-$V_{n2}$ as the reference voltage (rather than zero conventionally) applied at the 406A of the comparator 406.

Figure 6:
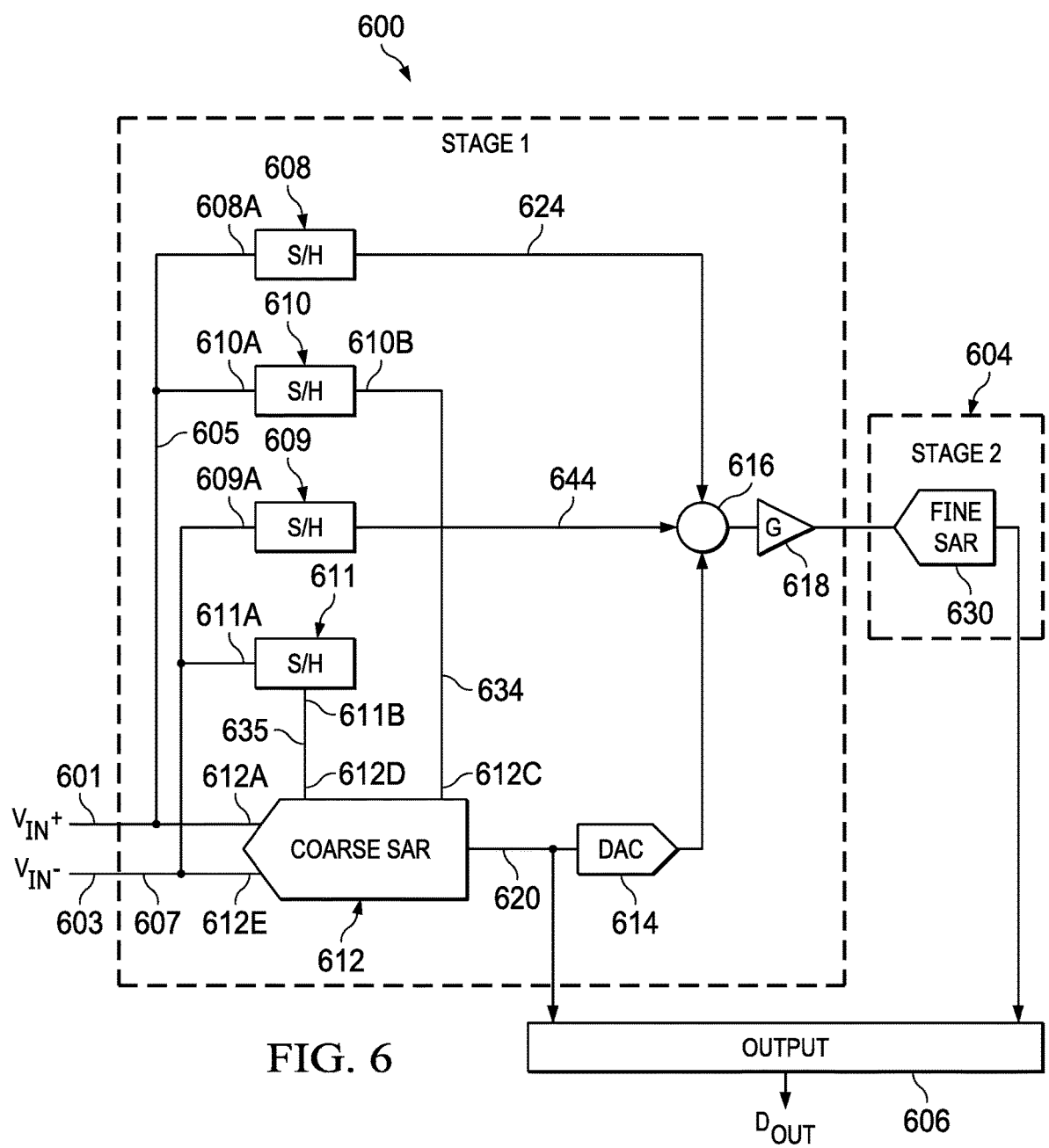
FIG. 6 shows a block diagram for a differential input two-step SAR ADC in accordance with this description.

FIG. 6 shows a block diagram for a differential input two-step SAR ADC 600 in accordance with this description. The differential input two-step SAR ADC 600 includes a first stage 602, a second stage 604, and output circuitry 606. The first stage 602 includes a sample-and-hold circuit 608, a sample-and-hold circuit 609, a sample-and-hold circuit 610, a sample-and-hold circuit 611, a SAR ADC 612, a digital-to-analog converter (DAC) 614 (the main DAC), subtraction circuitry 616, and a residue amplifier 618. The sample-and-hold circuit 608, the sample-and-hold circuit 610, and the SAR ADC 612 are coupled to the signal input terminal 601. The sample-and-hold circuit 609, the sample-and-hold circuit 611, and the SAR ADC 612 are coupled to the signal input terminal 603. The sample-and-hold circuit 608 includes an input terminal 608A coupled to the signal input terminal 601, the sample-and-hold circuit 610 includes an input terminal 610A coupled to the signal input terminal 601, and the SAR ADC 612 includes an input terminal 612A coupled to the signal input terminal 601. Each of the sample-and-hold circuit 608, the sample-and-hold circuit 610, and the SAR ADC 612 acquires a sample of the input signal 605 ($V_{IN}$+) to be digitized as provided at the signal input terminal 601.

The sample-and-hold circuit 609 includes an input terminal 609A coupled to the signal input terminal 603, the sample-and-hold circuit 611 includes an input terminal 611A coupled to the signal input terminal 603, and the SAR ADC 612 includes an input terminal 612E coupled to the signal input terminal 603. Each of the sample-and-hold circuit 609, the sample-and-hold circuit 611, and the SAR ADC 612 acquires a sample of the input signal 607 ($V_{IN}$-) to be digitized as provided at the signal input terminal 603.

The sample-and-hold circuit 608 and the sample-and-hold circuit 609 are implementations of the sample-and-hold circuit 108. The sample-and-hold circuit 610 and the sample-and-hold circuit 611 are implementations of the sample-and-hold circuit 110. The sample-and-hold circuit 610 is a down-scaled version of the sample-and-hold circuit 608, and the sample-and-hold circuit 611 is a down-scaled version of the sample-and-hold circuit 609. The sample-and-hold circuit 610 includes an input terminal 610A coupled to the signal input terminal 601 and an output terminal 610B coupled to the input terminal 612C of the SAR ADC 612. For any given sample 624 acquired by the sample-and-hold circuit 608, the sample-and-hold circuit 610 acquires a sample 634 having a same voltage as the sample 624. The sample-and-hold circuit 611 includes an input terminal 611A coupled to the signal input terminal 603 and an output terminal 611B coupled to the input terminal 612D of the SAR ADC 612. For any given sample 644 acquired by the sample-and-hold circuit 609, the sample-and-hold circuit 611 acquires a sample 635 having a same voltage as the sample 644.

Figure 7:
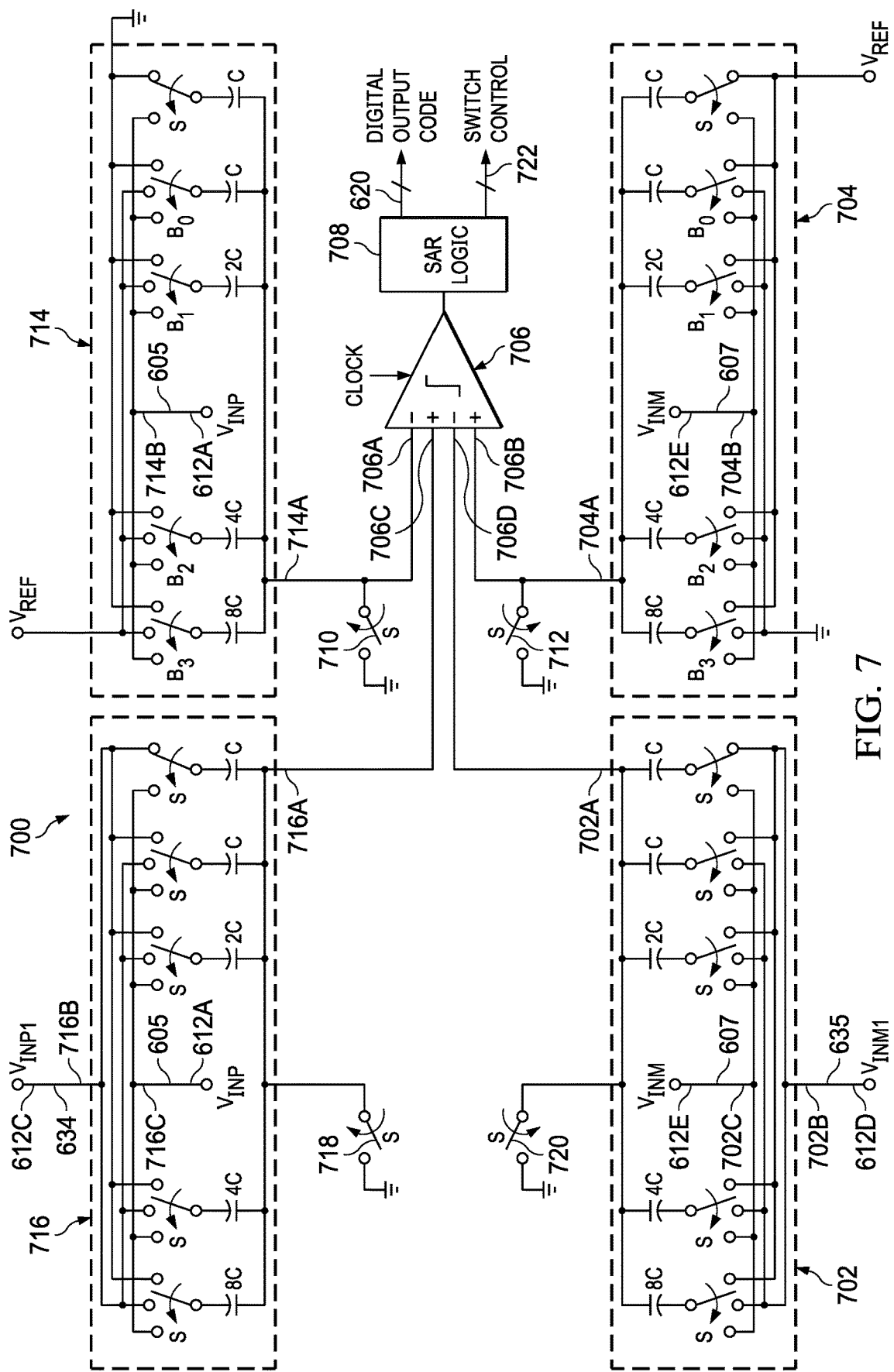
FIG. 7 shows a schematic diagram for a differential input coarse SAR ADC in accordance with this description.

FIG. 7 shows a schematic diagram for a differential input coarse SAR ADC 700 in accordance with this description. The differential input coarse SAR ADC 700 is an implementation of the SAR ADC 612. The differential input coarse SAR ADC 700 includes a CDAC 702, a CDAC 704, CDAC 714, a CDAC 716, a comparator 706, a SAR control circuit 708, a switch 710, a switch 712, a switch 718, and a switch 720. The SAR control circuit 708 is coupled to the comparator 706, the CDAC 702, the CDAC 704, the CDAC 714, and the CDAC 716. The CDAC 702, the CDAC 704, the CDAC 714, and the CDAC 716 include binary weighted capacitors and switches. In the CDAC 702 the switches are controllable to connect the bottom plates of the capacitors to the input terminal 612E or the input terminal 612D, and thereby to charge the capacitors to the voltage of the input signal 607 or the sample 635. The CDAC 702 includes an output terminal 702A coupled to an input 706D of the comparator 706, an input terminal 702B coupled to the input terminal 612D, and an input terminal 702C coupled to the input terminal 612E. The top plates of the capacitors of the CDAC 702 are coupled to the output terminal 702A. In the CDAC 702, the switches are controllable to connect the bottom plates of the capacitors of the CDAC 702 to the input terminal 612E or the input terminal 612D, and thereby to charge the capacitors to the voltage of the input signal 607 or the sample 635.

The CDAC 716 includes an output terminal 716A coupled to an input 706C of the comparator 706, an input terminal 716B coupled to the input terminal 612C, and an input terminal 716C coupled to the input terminal 612A of the SAR ADC 612. The top plates of the capacitors of the CDAC 716 are coupled to the output terminal 716A. In the CDAC 716, the switches are controllable to connect the bottom plates of the capacitors of the CDAC 716 to the input terminal 612A or the input terminal 612C, and thereby to charge the capacitors to the voltage of input signal 605 or the sample 634.

The CDAC 704 includes an output terminal 704A coupled to an input 706B of the comparator 706, and an input terminal 704B coupled to the input terminal 612E. The top plates of the capacitors of the CDAC 704 are coupled to the output terminal 704A. The switches of the CDAC 704 are controllable to connect the bottom plates of the capacitors to the input terminal 612E, a reference voltage source, or a common voltage source (e.g., ground).

The CDAC 714 includes an output terminal 714A coupled to an input 706A of the comparator 706, and an input terminal 714B coupled to the input terminal 612A. The top plates of the capacitors of the CDAC 714 are coupled to the output terminal 714A. The switches of the CDAC 714 are controllable to connect the bottom plates of the capacitors to the input terminal 612A, a reference voltage source, or a common voltage source (e.g., ground).

At the start of each sample digitization, the SAR control circuit 708 sets the switches of the CDAC 702 and the CDAC 704 to connect the bottom plates of the capacitors of the CDAC 702 and the CDAC 704 to the signal input terminal 603, and charge the capacitors of the CDAC 702 and the CDAC 704 to the voltage of the input signal 607. After the SAR control circuit 708 selects the values of one or more bits of the digital value 620, the SAR control circuit 708, via the switch control signals 722, sets the switches of the CDAC 702 to disconnect the bottom plates of the capacitors of the CDAC 702 from the signal input terminal 603, and connect the bottom plates of the capacitors of the CDAC 702 to the output 611B of the sample-and-hold circuit 611 to charge the capacitors to the voltage of the sample 635. As a result, the voltage on the top plates of the capacitors of the CDAC 702 is set to the voltage of the sample 635 less the previously sampled voltage of the input signal 607.

Similarly, at the start of each sample digitization, the SAR control circuit 708 sets the switches of the CDAC 714 and the CDAC 716 to connect the bottom plates of the capacitors of the CDAC 714 and the CDAC 716 to the signal input terminal 601, and charge the capacitors of the CDAC 714 and the CDAC 716 to the voltage of the input signal 605. After the SAR control circuit 708 selects the values of one or more bits of the digital value 620, the SAR control circuit 708 sets the switches of the CDAC 716 to disconnect the bottom plates of the capacitors of the CDAC 716 from the signal input terminal 601, and connect the bottom plates of the capacitors of the CDAC 716 to the output 610B of the sample-and-hold circuit 610 to charge the capacitors to the voltage of the sample 634. As a result, the voltage on the top plates of the capacitors of the CDAC 716 is set to the voltage of the sample 634 less the previously sampled voltage of the input signal 605.

Modifications are possible in the described embodiments, and other embodiments are possible, within the scope of the claims.

What is claimed is:

1. An analog-to-digital converter (ADC) circuit, comprising:
   a signal input terminal;
   a sample-and-hold circuit comprising an input terminal coupled to the signal input terminal;
   a successive approximation register (SAR) ADC comprising:
      a comparator;
      a first capacitive digital-to-analog converter (CDAC) comprising:
         a first input terminal coupled to the signal input terminal;
         a second input terminal coupled to an output terminal of the sample-and-hold circuit; and
         an output terminal coupled to a first input terminal of the comparator; and a second CDAC comprising:
a first input terminal coupled to the signal input terminal; and
an output terminal coupled to a second input terminal of the comparator.

2. An analog-to-digital converter (ADC) circuit, comprising:
a sample-and-hold circuit configured to sample an input signal to be digitized;
a successive approximation register (SAR) ADC coupled to the sample-and-hold circuit, and configured to digitize the input signal; wherein the SAR ADC comprises:
a comparator;
a first capacitive digital-to-analog converter (CDAC) coupled to a first input of the comparator, and configured to:
sample the input signal to be digitized; and
sample an output of the sample-and-hold circuit; and
a second CDAC coupled to a second input of the comparator, and configured to sample the input signal to be digitized.

3. The ADC circuit of claim 2, further comprising a SAR control circuit coupled to the comparator, the first CDAC and the second CDAC, and configured to:
set switches of the first CDAC to charge capacitors of the first CDAC to a voltage of the input signal to be digitized during selection of a first bit; and
set switches of the first CDAC to charge capacitors of the first CDAC to a voltage of the output of the sample-and-hold circuit during selection of a second bit.

4. The ADC circuit of claim 3, wherein the first CDAC is configured to provide, to the comparator, a voltage equal to a difference of the voltage of the input signal to be digitized and the voltage of the output of the sample-and-hold circuit.

5. The ADC circuit of claim 2, wherein the sample-and-hold circuit comprise:
a sampling capacitor;
an amplifier; and
switches configured to:
disconnect the amplifier from the sampling capacitor in a sample interval; and
connect the amplifier to the sampling capacitor in a hold interval.

6. The ADC circuit of claim 2, further comprising:
a main DAC coupled to the SAR ADC, and configured to generate a voltage corresponding to a digital value generated by the SAR ADC; and
subtraction circuitry coupled to the main DAC, and configured to generate a difference of the output of the sample-and-hold circuit and the voltage generated by the main DAC.

7. The ADC circuit of claim 6, wherein:
the SAR ADC is a first SAR ADC; and
the ADC circuit further comprises:
a residue amplifier coupled to the subtraction circuitry, and configured to amplify output of the subtraction circuitry; and
a second SAR ADC coupled to the residue amplifier, and configured to digitize an output of the residue amplifier.

8. An ADC circuit, comprising:
a first signal input terminal;
a second signal input terminal;
a first sample-and-hold circuit comprising an input terminal coupled to the first signal input terminal;
a second sample-and-hold circuit comprising an input terminal coupled to the second signal input terminal;
a successive approximation register (SAR) ADC comprising:
a comparator;
a first capacitive digital-to-analog converter (CDAC) comprising:
a first input terminal coupled to the first signal input terminal;
a second input terminal coupled to an output terminal of the first sample-and-hold circuit; and
an output terminal coupled to a first input terminal of the comparator; and
a second CDAC comprising:
a first input terminal coupled to the second signal input terminal;
a second input terminal coupled to an output terminal of the second sample-and-hold circuit; and
an output terminal coupled to a second input terminal of the comparator.

9. The ADC circuit of claim 8, further comprising a SAR control circuit coupled to the comparator the first CDAC, and the second CDAC, and configured to, in a given bit decision cycle:
disconnect bottom plates of capacitors of the first CDAC from the first signal input terminal;
connect the bottom plates of the capacitors of the first CDAC to the first sample-hold-circuit;
disconnect bottom plates of capacitors of the second CDAC from the second signal input terminal; and
connect the bottom plates of the capacitors of the second CDAC to the second sample-hold-circuit.

* * * * *